United States Patent
Arsovski et al.

(10) Patent No.: US 8,228,713 B2
(45) Date of Patent: *Jul. 24, 2012

(54) SRAM HAVING WORDLINE UP-LEVEL VOLTAGE ADJUSTABLE TO ASSIST BITCELL STABILITY AND DESIGN STRUCTURE FOR SAME

(75) Inventors: Igor Arsovski, Williston, VT (US); John A. Fifield, Underhill, VT (US); Robert M. Houle, Williston, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/892,160

(22) Filed: Sep. 28, 2010

(65) Prior Publication Data

US 2012/0075918 A1 Mar. 29, 2012

(51) Int. Cl.
G11C 11/00 (2006.01)
(52) U.S. Cl. ............ 365/154; 365/230.06; 365/194
(58) Field of Classification Search .............. 365/154, 365/230.06, 194
See application file for complete search history.

(56) References Cited

U.S. PATENT DOCUMENTS

| | | | |
|---|---|---|---|
| 2,715,361 | A | 8/1955 | Lasseter |
| 7,079,426 | B2 | 7/2006 | Zhang et al. |
| 7,085,175 | B2 | 8/2006 | Remington et al. |
| 7,177,176 | B2 | 2/2007 | Zheng et al. |
| 7,352,609 | B2 | 4/2008 | Fifield et al. |
| 7,403,426 | B2 | 7/2008 | Hamzaoglu et al. |
| 7,495,950 | B2 | 2/2009 | Fifield et al. |
| 7,570,525 | B2 | 8/2009 | Nii et al. |
| 7,602,654 | B2 | 10/2009 | Yabuuchi et al. |
| 2008/0049534 | A1 | 2/2008 | Fifield et al. |
| 2010/0188886 | A1* | 7/2010 | Behrends et al. ........ 365/154 |

OTHER PUBLICATIONS

Related U.S. Appl. No. 12/892,191, filed Sep. 28, 2010, entitled "Methods and Systems for Adjusting Wordline Up-Level Voltage to Improve Production Yield Relative to SRAM-Cell Stability," Igor Arsovski.
Hyunwoo Nho, et al. "A 32nm High-κ Metal Gate SRAM with Adaptive Dynamic Stability Enhancement for Low-Voltage Operation," ISSCC 2010/Session 19/ High-Performance Embedded Memory/19.3; 2010 IEEE International Solid-State Circuits Conference, Feb. 2010; pp. 346-347.
Yuki Fujimura, et al. "A Configurable SRAM with Constant-Negative-Level Write Buffer for Low-Voltage Operation with 0.149μm2 Cell in 32 nm High-κ Metal Gate CMOS," ISSCC 2010/Session 19/ High-Performance Embedded Memory/19.4; 2010 IEEE International Solid-State Circuits Conference, Feb. 2010; pp. 348-349.
S. Ohbayashi, et al. "A 65 nm SoC Embedded 6T-SRAM Design for Manufacturing with Read and Write Cell Stabilizing Circuits," 2006 Symposium on VLSI Circuits Digest of Technical Papers; Jun. 2006, IEEE. K. Nii, "A 45-nm Single-port and Dual-port SRAM family with Robust Read/Write Stabilizing Circuitry under DVFS Environment," 2008 Symposium on VLSI Circuits Digest of Technical Papers; Mar. 2008; IEEE; pp. 212, 213.

* cited by examiner

*Primary Examiner* — Huan Hoang
(74) *Attorney, Agent, or Firm* — Downs Rachlin Martin PLLC (57) ABSTRACT

An integrated circuit that includes memory containing wordlines and bitcells having SRAM storage elements and being connected to the wordlines. Wordline up-level assist circuitry is provided that is designed and configured to provide a plurality of selectable voltage values that can be selected to provide the wordline up-level voltage that is provided to the bitcells during a memory read cycle and/or write cycle. In one example, the voltage value selected is selected based on characterization of the as-fabricated bitcells so as to decrease the likelihood of the bitcells experiencing a stability failure.

25 Claims, 7 Drawing Sheets

SRAM HAVING WORDLINE UP-LEVEL VOLTAGE ADJUSTABLE TO ASSIST BITCELL STABILITY AND DESIGN STRUCTURE FOR SAME

FIELD OF THE INVENTION

The present invention generally relates to the field of semiconductor devices containing static random access memory (SRAM). In particular, the present invention is directed to SRAM having wordline up-level voltage adjustable to assist bitcell stability and a design structure for same.

BACKGROUND

Static random access memory (RAM), or "SRAM," is an important type of semiconductor memory used in many integrated circuit applications, from embedded memory (e.g., as cache memory and register files) in general purpose processors and application specific integrated circuits to external memories. SRAM is a desirable type of memory due to its high-speed, low power consumption, and simple operation. Unlike dynamic RAM, SRAM does not need to be regularly refreshed to retain the stored data, and its design is generally straightforward.

A typical SRAM bitcell includes a pair of cross-coupled inverters that hold a desired data bit value (i.e., either a 1 or a 0) and the complement of that value. While SRAM is a desirable type of memory, it is known that if not properly designed and fabricated, an SRAM bitcell can become unstable when accessed, at which point the held bit value is upset, i.e., switches. Of course, such instability is intolerable. Unfortunately, the stability of an SRAM bitcell is in full conflict with the write-ability of the bitcell with respect to the strengths of the N-type devices (transistors) and P-type devices (transistors) within the bitcell. Historically, SRAM bitcells have typically been optimized to strike a balance between stability and write-ability. However, with decreasing feature sizes and decreasing operating voltages conventional balancing techniques are meeting their limits.

SUMMARY OF THE DISCLOSURE

In one implementation, the present disclosure is directed to an integrated circuit, which includes: a memory array comprising a plurality of bitcells having a static-random-access-memory (SRAM) architecture; a plurality of wordlines operatively connected to the plurality of bitcells; wordline driver circuitry designed and configured to provide a wordline up-level voltage to each of the plurality of wordlines, the wordline driver circuitry including wordline up-level assist circuitry designed and configured to provide a plurality of selectable values for the wordline up-level voltage.

In another implementation, the present disclosure is directed to an integrated circuit, which includes: static random access memory (SRAM) circuitry that includes: a complementary pair of bitlines having a first bitline and a second bitline; a first pass-gate device having a first gate electrode; a second pass-gate device having a second gate electrode; a bit cell containing: a first internal node electrically coupled to the first bitline across the first pass-gate device, the first internal node provided to be charged to a bit-value voltage level during use of the bit cell to store a bit value; and a second internal node electrically coupled to the second bitline across the second pass-gate device, the second internal node provided to be charged to the complement of the bit value voltage level during use of the bit cell to store the bit value; a wordline electrically coupled to each of the first and second gate electrodes, respectively, of the first and second pass-gate transistors; and wordline driver circuitry electrically coupled to the wordline so as to provide the wordline with an up-level voltage, wherein the wordline driver circuitry includes: wordline up-level assist circuitry configured to provide, one at a time, a plurality of selectable predetermined voltage levels for the up-level voltage; and selection circuitry responsive to a selection input that effects the selection of the up-level voltage from the plurality of selectable predetermined voltage values.

In still another implementation, the present disclosure is directed to a non-transitory machine-readable storage medium containing a design structure for use in a design process for an integrated circuit system. The design structure includes: static random access memory circuitry that includes: a complementary pair of bitlines having a first bitline and a second bitline; a first pass-gate device having a first gate electrode; a second pass-gate device having a second gate electrode; a bit cell containing: a first internal node electrically coupled to the first bitline across the first pass-gate device, the first internal node provided to be charged to a bit-value voltage level during use of the bit cell to store a bit value; and a second internal node electrically coupled to the second bitline across the second pass-gate device, the second internal node provided to be charged to the complement of the bit value voltage level during use of the bit cell to store the bit value; a wordline electrically coupled to each of the first and second gate electrodes, respectively, of the first and second pass-gate transistors; and wordline up-level driver circuitry electrically coupled to the wordline so as to provide the wordline with an up-level voltage, wherein the wordline up-level driver circuitry includes: drive-voltage circuitry configured to provide, one at a time, a plurality of possible predetermined up-level voltages; and selection circuitry responsive to a selection input that effects the selection of the up-level voltage from the plurality of possible predetermined up-level voltages.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
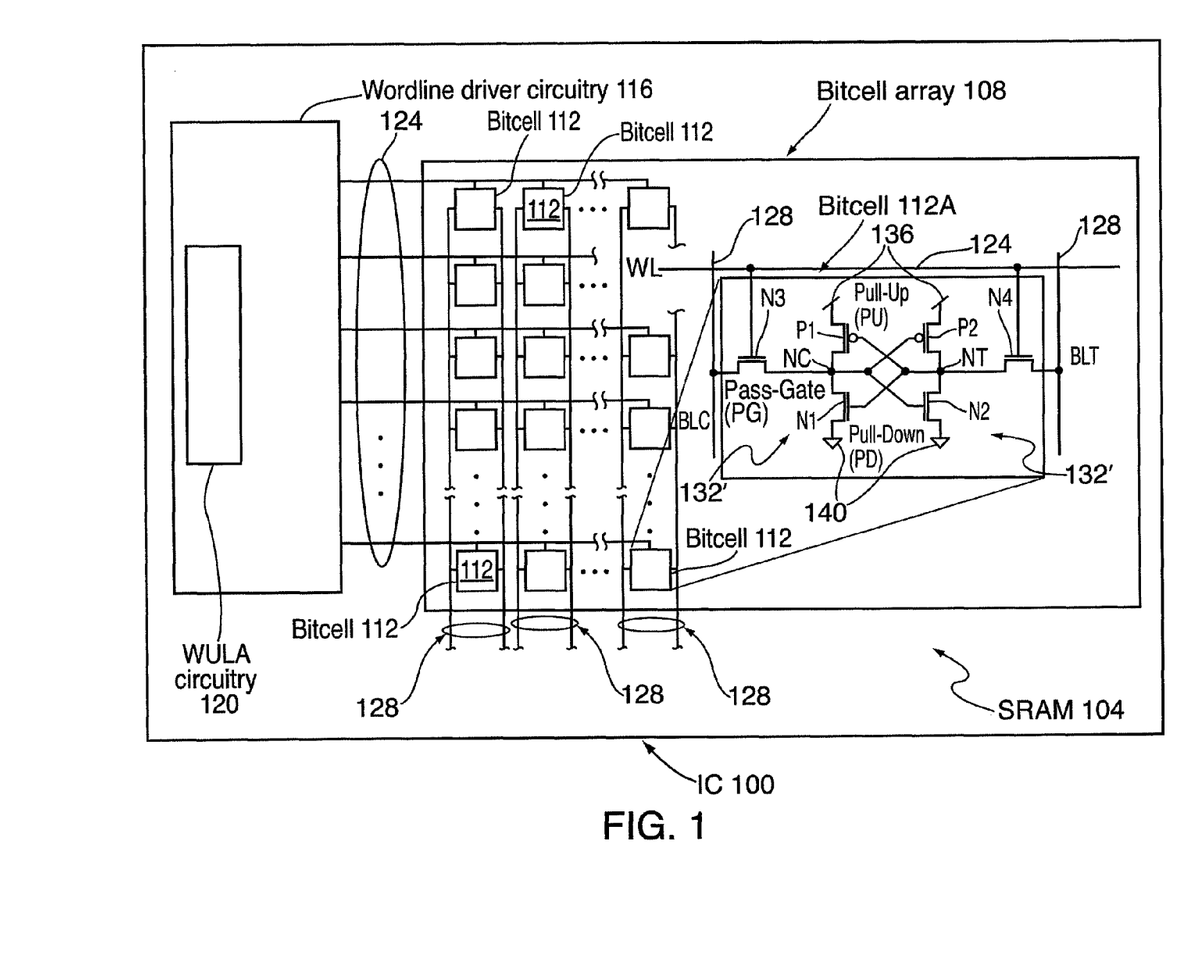
FIG. 1 is a high-level diagram of an integrated circuit that includes an SRAM that includes wordline driver circuitry having wordline up-level assist circuitry made in accordance with the present invention.

Referring now to the drawings, FIG. 1 illustrates an integrated circuit (IC) 100 that includes a static random access memory (SRAM) 104 that contains an array 108 of bitcells 112 and wordline driver circuitry 116. As those skilled in the art will readily appreciate, IC 100 can be any IC that includes one or more SRAMs, such as a microprocessor, application-specific IC, system-on-chip IC, memory chip, etc. Driver circuitry 116 includes wordline up-level assist (WULA) circuitry 120 that allows for selecting and setting a desired wordline up-level voltage from among a number of possible up-level voltage values. In one example, the desired wordline up-level voltage is selected based on certain as-tested voltage values obtained from testing SRAM 104 after fabrication. Bitcells 112 are operatively connected to corresponding wordlines 124 and complementary-pair bitlines 128 in a manner known in the art. As described below in detail, one motivation for providing multiple selectable up-level voltage values is to enhance the stability of individual bitcells 112 within SRAM 104 by reducing up-level wordline voltages, which, in turn, decreases the injection of electrical charge into the bitcells when any of the wordlines 124 within the memory is asserted. As is known, charge injection through pass-gate transistors (N3/N4 in 132') during a read-disturb, such as a read cycle or half-select write cycle, tends to cause bitcells 112 to become unstable. Instability can become a significant design issue with the relative small device sizes and low operating voltages of modern SRAM.

As an example of the benefit that an SRAM having WULA circuitry made in accordance with the present disclosure provides, envision a six-transistor SRAM cell, fabricated in 32-nm technology and having a VCS (SRAM Core Supply) voltage of 0.7 volts. With typical process variation in the manufacturing process used to make such an SRAM cell, the stability failure rate is about 13 stability failures for every megabit (Mb) of memory. However, with WULA circuitry that provides selectability between a normal wordline voltage level VCS (i.e., 0.7 V) and a reduced wordline voltage level (VCS−50 mV) (i.e., 0.65 V), and wherein the selection depends on where each fabricated SRAM falls within the process variation space, the proper selection of the reduced wordline voltage level for SRAMs having a fast NFET process corner can result in the reduction of the stability failure rate to about 1 failure per 10 Mb of memory. In this example, the proper use of wordline up-level reduction can improve the stability failure rate by as much as 1σ, depending upon process variation, voltage, and temperature.

Before describing WULA circuitry 120 in further detail and providing examples of that circuitry, exemplary bitcell 112A is first described to provide an explanation of the functioning of such a bitcell and issues relating to its stability.

Those skilled in the art will readily appreciate that bitcell 112A is representative of each of bitcells 112 in array 108. As mentioned above, in this example bitcell 112A is a six-transistor, or "6T," cell and WULA 120 allows a user to select and set a desired wordline up-level voltage based on as-tested voltage values obtained from testing SRAM 104 after fabrication. In one example, the wordline voltage selected and set is selected to enhance the operation of SRAM 104 depending on whether the fabricated SRAM is write-limited, stability limited, or somewhere in between write-limited and stability-limited.

In the example shown, bitcell 112A includes a pair of cross-coupled inverters 132, 132' each formed by one of a pair p-type load (or pull-up) transistors P1, P2 electrically connected to a voltage source line 136 and a corresponding one of a pair of n-type drive (or pull-down) transistors N1, N2 electrically connected to a voltage sink line 140, e.g., ground. Together, cross-coupled inverters 132, 132' form a flip-flop circuit that is capable of storing a single data bit. Bitcell 112A has two stable states used to denote a "1" bit and a "0" bit, respectively, on internal "storage" nodes NC, NT. Two additional n-type transistors N3, N4, called "access" or "pass-gate" transistors, electrically connect cross-coupled inverters 132, 132' to corresponding respective ones of bit lines BLC, BLT and are controlled by a corresponding wordline, here wordline WL1.

To function properly, each storage node NC, NT holds a voltage level, either high (logic "1") or low (logic "0"). When reading data from bitcell 112A, the current generated as pass-gate transistors N3, N4 turn on must not flip the voltage level at the storage nodes NC, NT from one logic level to the other. To stabilize bitcell 112A, driver, or pull-down, transistors N1, N2 are typically fabricated to have a higher conductance than pass-gate transistors N3, N4 so that the storage node NC, NT that stores a logic "0" will be held low by the strong pull-down transistor. It is known that a 6T SRAM bitcell, such as bitcell 112A, suffers a stability problem associated with a read operation or a "half-select" write operating mode. In the half-select mode, a row, i.e., one of wordlines 124, is selected while one or more columns, i.e., one or more complementary-pair bitlines 128, are not selected. In this case, the non-selected complementary-pair bitline(s) 128 is/are subjected to the read disturb condition.

Accessing bitcell 112A for a read or a write operation entails driving wordline 124 in a manner that turns on pass-gate transistors N3, N4 for all of the SRAM cells on that wordline. With pass-gate transistors N3, N4 turned-on, cross-coupled inverters 132, 132' are electrically coupled to the corresponding bitline pairs BLC, BLT, partially selecting (or "half selecting") all of the bitcells, such as bitcell 112A, on wordline 124. Selecting one of the columns (here, one of complementary-pair bitlines 128) selects the corresponding bitcell 112 on that wordline 124 containing the bits actually being accessed. The remaining (M−1)-by-K bitcells 112 remain half-selected during the access.

During a read cycle, each bitcell 112 on the selected wordline 124 couples its contents to its corresponding complementary-pair bitlines 128 such that each of the bitlines may droop, usually, only to develop a small-differential signal (e.g., 50 mV). At some point after sensing data for the selected bits, the selected wordline 124 returns low, deselecting/isolating bitcells 112 on that wordline. As long as the selected wordline 124 remains high, however, pass gate transistors N3, N4 (see bitcell 112A) in each accessed bitcell 112 couple the reference voltage onto both internal storage nodes NC, NT. Depending upon the length of time that the selected wordline 124 remains high, the pass-gate transistors N3, N4 coupling the partially selected cells to complementary-pair bitlines 128 tend to pull cross-coupled inverters 132, 132' (i.e., the storage nodes NC, NT) toward a common voltage. This is normally a measure of the stability of an SRAM cell. That is, measuring the stability of an SRAM cell involves selecting the SRAM cell, clamping the corresponding bitline pairs to a voltage, and noting the point at which the cell becomes unstable or switches, i.e., is upset. Imbalances in cell devices can upset half-selected cells or at the very least to become unstable at normal design voltages. This instability is intolerable.

Figure 2A:
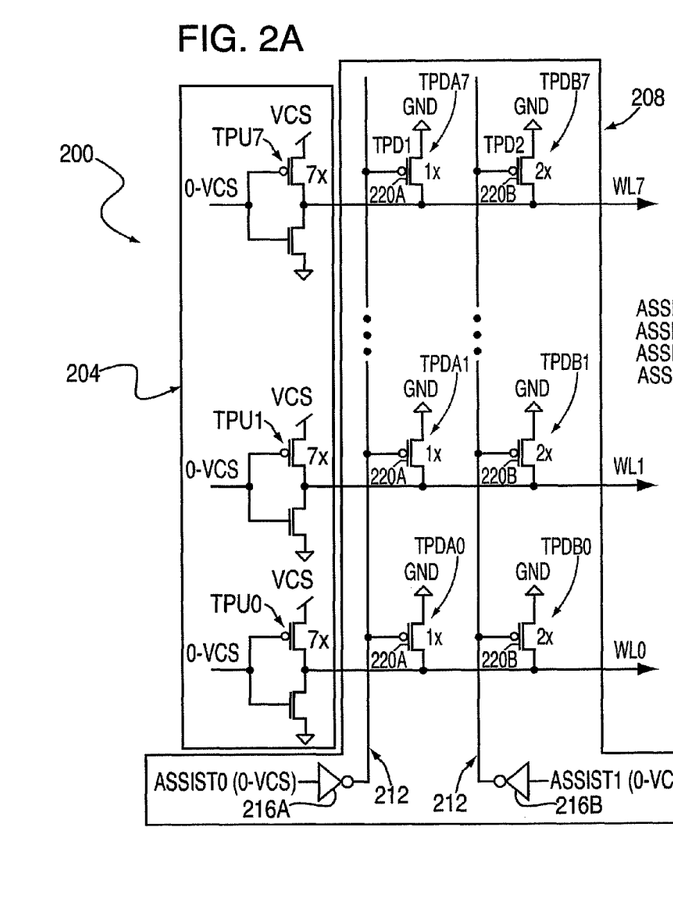
FIG. 2A is a schematic diagram of wordline driver circuitry that can be used, for example, as the wordline driver circuitry of FIG. 1.

FIG. 2A illustrates wordline driver circuitry 200 that can be used to implement a WULA scheme in an SRAM, such as SRAM 104 of FIG. 1. In this example, wordline driver circuitry 200 is configured to provide four possible wordline voltage levels that can be selected for the actual wordline voltage level to use in the fabricated SRAM. Of course, only a portion of wordline driver circuitry 200 is shown for clarity and convenience.

Wordline driver circuitry 200 includes drive-voltage circuitry 204 for providing a drive voltage, such as VCS, to a plurality of wordlines, here, wordlines WL0 to WL7. In this example, each wordline WL0-WL7 is driven by a corresponding pull-up device, here, transistors TPU0 to TPU7. Wordline driver circuitry 200 also includes WULA circuitry 208 that includes a pair of pull-down devices, here, transistors TPDA0, TPDB0 to TPDA7, TPDB7, for each wordline WL0 to WL7. Although not shown, the bitcells associated with each wordline WL0 to WL7 are to the right of the corresponding transistor pairs TPDA0, TPDB0 to TPDA7, TPDB7 relative to FIG. 2A. WULA circuitry 208 also includes selection circuitry 212 that permits the selection of which pull-down transistors, i.e., either transistors TPDA0 to TPDA7 or transistors TPDB0 to TPDB7, or both sets, to activate so as to select the desired wordline up-level voltage value. In this example, selection circuitry 212 includes two buffers 216A, 216B for driving the corresponding respective gate electrodes 220A, 220B upon selection of the corresponding buffer.

Figure 2B:
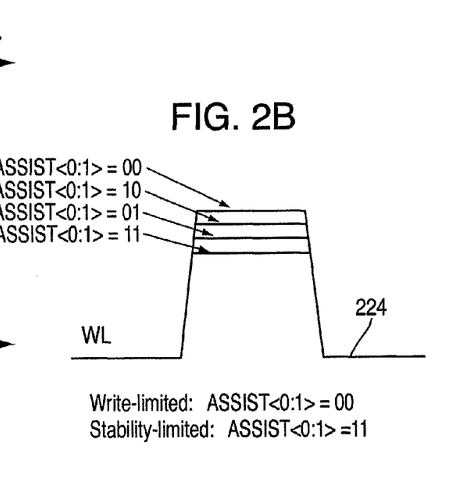
FIG. 2B is a waveform diagram illustrating the four possible wordline voltage levels available using the wordline driver circuitry of FIG. 2A.

As mentioned above, wordline driver circuitry 200 is configured to provide four possible wordline up-level voltage values. This is achieved in this example by making each pull-down transistor TPDA0 to TPDA7 one strength (here, 1×) and making each pull-down transistor TPDB0 to TBDB7 another strength (here, 2×). By making each pull-down transistor TPDB0 to TPDB7 twice as strong as each pull-down transistor TPDA0 to TPDA7, those skilled in the art can appreciate that three equal voltage steps can be achieved as follows. Referring to FIG. 2B, as well as to FIG. 2A, when neither of buffers 216A, 216B are selected i.e., ASSIST<0:1>=00, neither transistors TPDA0 to TPDA7 nor transistors TPDB0 to TPDB7 are selected. Therefore, none of these transistors TPDA0 to TPDA7, TPDB0 to TPDB7 are active, and no pull-down is occurring on wordlines WL0 to WL7. Therefore, the wordline voltage 224 (FIG. 2B) is at the full VCS level.

However, when buffer 216A is selected and buffer 216B is not selected, i.e., when ASSIST<0:1>=10, pull-down transistors TPDA0 to TPDA7 are activated, thereby pulling wordline voltage 224 (FIG. 2B) on each wordline WL0 to WL7 down by 1×, according to the strength of these transistors. Similarly, when buffer 216B is selected and buffer 216A is not selected, i.e., when ASSIST<0:1>=01, pull-down transistors TPDB0 to TPDB7 are activated, thereby pulling wordline voltage 224 (FIG. 2B) on each wordline WL0 to WL7 down by 2×, depending on the strength of these transistors. Then, when both buffers 216A, 216B are selected, i.e., when ASSIST<0:1>=11, all of pull-down transistors TPDA0 to TPDA7, TPDB0 to TPDB7 are activated, thereby pulling wordline voltage 224 (FIG. 2B) on each wordline WL0 to WL7 down by a total of 3×, i.e., the sum of each the 1× of transistors TPDA0 to TPDA7 and the 2× of the corresponding one of transistors TPDB0 to TPDB7. As those skilled in the art will understand, in other embodiments more or fewer pull-down devices can be provided on each wordline and the strengths of the pull-down devices can be other than the strengths illustrated, among other changes that can be readily implemented by those skilled in the art.

Figure 3:
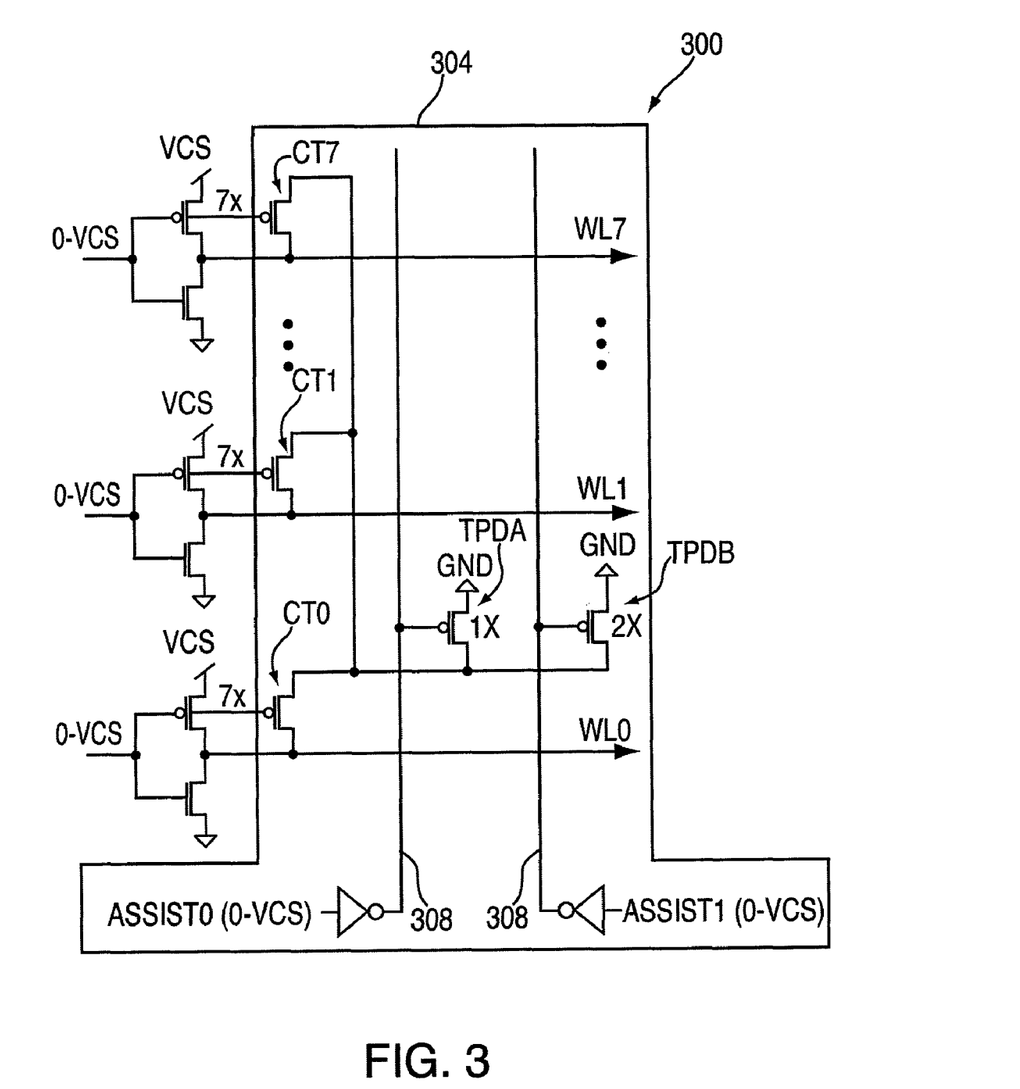
FIG. 3 is a schematic diagram of alternative wordline driver circuitry that can be used, for example, as the wordline driver circuitry of FIG. 1, in which wordline pull-down devices are amortized over a set of wordlines.

FIG. 3 illustrates a variation on wordline driver circuitry 200 of FIG. 2A. In FIG. 3, the eight wordlines WL0 to WL7 of wordline driver circuitry 300 "share" two pull-down devices, here, pull-down transistors TPDA, TPDB of WULA circuitry 304, instead of each wordline having its own pair of pull-down devices as shown in FIG. 2A. In this example, pull-down transistors TPDA, TPDB are electrically coupled to wordlines WL0 to WL1 via corresponding respective coupling transistors CT0 to CT7. Like the embodiment of FIG. 2, pull-down transistors TPDA, TPDB have relative strengths of 1× and 2×, respectively, thereby providing for individually selectable wordline voltage level possibilities, as shown in FIG. 2B. In this example, WULA circuitry 304 includes selection circuitry 308 that is essentially the same as selection circuitry 212 of FIG. 2A. Therefore, the process of selecting from among the four wordline voltage values in wordline driver circuitry 300 of FIG. 3 is the same as for the process for wordline driver circuitry 200 of FIG. 2A.

Figures 4A, 4B, 4C:
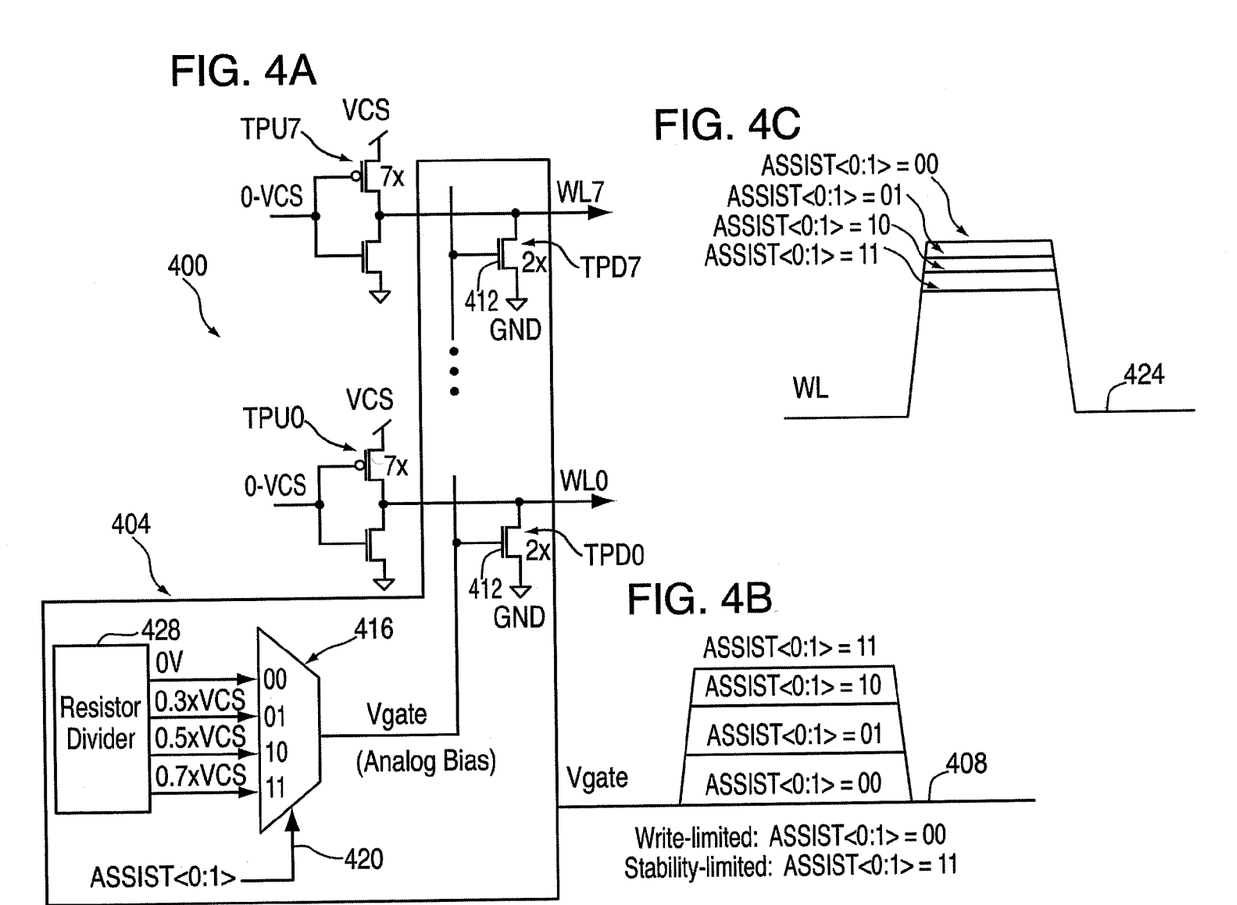
FIG. 4A is a schematic diagram of another alternative wordline driver circuitry that can be used, for example, as the wordline driver circuitry of FIG. 1.
FIG. 4B is a waveform diagram illustrating the four possible gate voltage levels output by the selection circuitry of the wordline driver circuitry of FIG. 4A.
FIG. 4C is a waveform diagram illustrating the four possible wordline voltage levels available using the wordline driver circuitry of FIG. 4A.

FIG. 4A shows alternative wordline driver circuitry 400 having WULA circuitry 404 that utilizes a single pull-down device, here, a pull-down transistor TPD0 to TPD7, per wordline WL0 to WL7, to provide four possible wordline voltage levels. Like wordline driver circuitries 200, 300 of FIGS. 2 and 3A, wordline driver circuitry 400 of FIG. 4A could be used for wordline driver circuitry 116 of FIG. 1, depending on the configuration of SRAM 104. Referring to FIG. 4A, in this example each pull-down transistor TPD0 to TPD7 has a relative strength of 2×, as compared to pull-up transistors TPU0 to TPU7, each of which has a strength of 7×. Of course, in alternative embodiments, the relative strengths of pull-down and pull-up transistors TPD0 to TPD7 and TPU0 to TPU7 can be different, depending on the parameters at issue.

The embodiment of FIG. 4A utilizes a variable analog gate-bias voltage 408 (FIG. 4B) to drive the gate electrodes 412 of pull-down transistors TPD0 to TPD7. Specifically in this example, WULA circuitry 404 includes a multiplexer 416 having four selectable voltage input levels for gate-bias voltage 408 (FIG. 4B), here, 0V, 0.3×VCS, 0.5×VCS, and 0.7×VCS that are individually selectable via a select input 420 that accepts input signal ASSIST<0:1>. As seen in FIG. 4B, the 0V level is output by multiplexer 416 when ASSIST<0:1>=00, the 0.3×VCS level is output by the multiplexer when ASSIST<0:1>=01, the 0.5×VCS level is output by the multiplexer when ASSIST<0:1>=01, and the 0.7×VCS level is output by the multiplexer when ASSIST<0:1>=11.

As those skilled in the art will appreciate, the amount pull-down provided by pull-down transistors TPD0 to TPD7 varies with the magnitude of gate-bias voltage 408 applied to gate electrodes 412 of the transistors; the higher the applied voltage, the greater the pull-down effect. This is shown in FIG. 4C. When gate-bias voltage 408 is 0V (ASSIST<0:1>=00), the wordline up-level voltage 424 is at its highest level, when the gate-bias voltage is 0.3×VCS (ASSIST<0:1>=01), the wordline up-level voltage is at its second highest level, when the gate-bias voltage is 0.5×VCS (ASSIST<0:1>=10), the wordline up-level voltage is at its second lowest pulse level, and when the gate-bias voltage is 0.7×VCS (ASSIST<0:1>=11), the wordline up-level voltage is at its lowest pulse level. In the embodiment shown, the four levels of gate-bias voltage 408 are provided by a resistor-divider 428. As those skilled in the art will understand, in other embodiments more or fewer gate-bias voltage levels can be provided, the levels can be other than the levels illustrated, and the levels can be provided by means other than resistor-divider 428, among other changes that can be readily implemented by those skilled in the art. In addition, it is noted that the variable-gate-bias features of WULA circuitry 412 of FIGS. 4A-C can be readily adapted by a skilled artisan to the shared pull-down device arrangement of FIG. 3.

Figure 5:
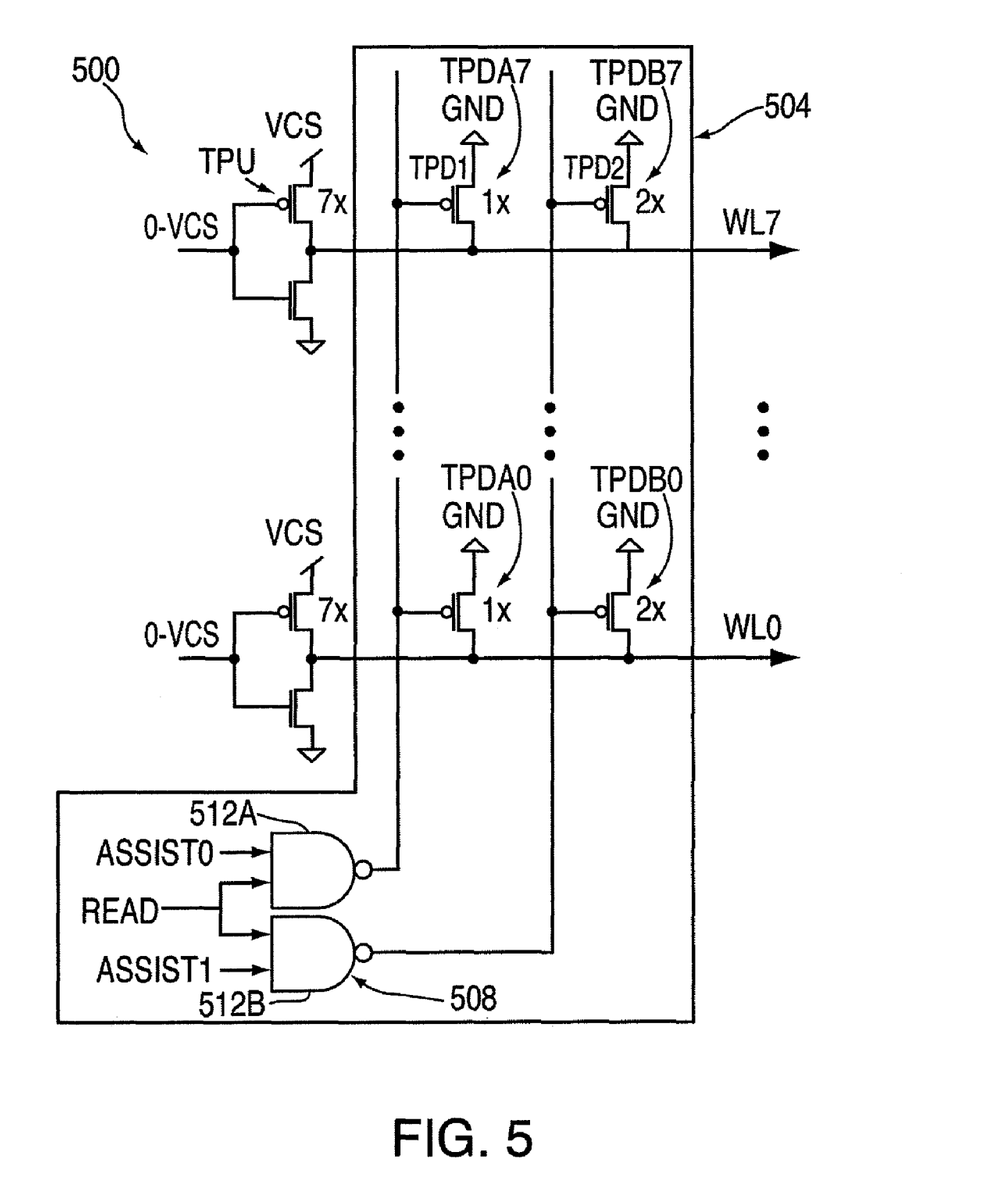
FIG. 5 is a schematic diagram of another alternative wordline driver circuitry that can be used, for example, as the wordline driver circuitry of FIG. 1, when the SRAM does not have half-select operations.

FIG. 5 illustrates wordline driver circuitry 500 particularly configured to be used with SRAM-based architectures, for example, register files, ternary content addressable memory, etc., that do not have half-select operations. In such architectures, all columns, i.e., bitlines, are written during write cycles, such that any wordline up-level assist need only be active during a read cycle. It can be readily seen from comparing FIG. 5 to FIG. 2A that wordline driver circuitries 500, 200 are generally identical to one another, except that in WULA circuitry 504 of FIG. 5, logic 508 appears in place of buffers 216A, 216B. As those skilled in the art will readily appreciate, logic 508 is provided so that each set of pull-down transistors TPDA0 to TPDA7 and TPDB0 to TPDB7 is activated only during a read operation.

In the example shown, each of pull-down transistors TPDA0 to TPDA7 and TPDB0 to TPDB7 is activated when the corresponding select input signal ASSIST0, ASSIST1 is asserted high, and during a read operation, a read signal READ is asserted high. Consequently, one way to structure logic 508 is to apply each select input signal ASSIST0, ASSIST1 to a corresponding NAND gate 512A-B and apply read signal READ to each of those gates. With this arrangement, the gates 512A, 512B of pull-down transistors TPDA0 to TPDA7 and TPDB0 to TPDB7 will only be activated (by a high signal) when both the corresponding select input signal ASSIST0, ASSIST1 is asserted high simultaneously with a high assertion of read signal READ. Of course, in other embodiments, other logic can be used in place of logic 508. Those skilled in the art will readily appreciate that similar logic can be applied to other embodiments of WULA circuitry, such as WULA circuitries 208, 304, 412 of FIGS. 2A, 3, and 4A, respectively.

When an SRAM, such as SRAM 104, is subjected to a degraded wordline up-level voltage, it can be necessary to compensate critical timings, such as the timing of the wordline pulse and the timing of sense-amplifier-set signals, to account for degradation in signal margin or write margin. This is especially true where a wordline up-level assist reduced voltage is applied during a slow process corner, whether inadvertent or not. Performance is affected as timing is delayed with wordline up-level assist invoked, but signal margin and write margin yield is recoverable.

Figure 6:
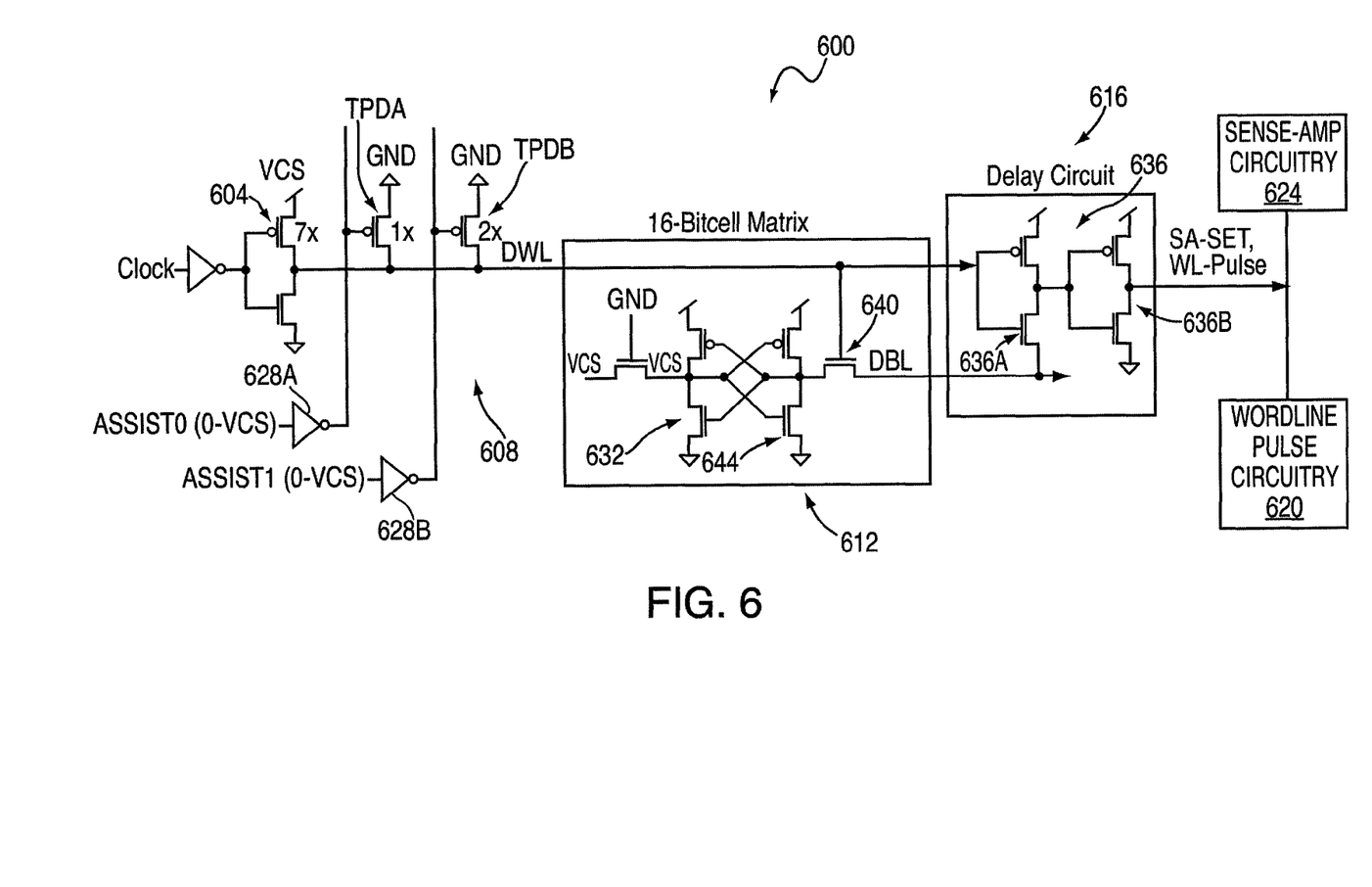
FIG. 6 is a schematic diagram of a delay circuit that can be used to control critical timings of wordline pulse and sense-amplifier set signals.

FIG. 6 illustrates delay circuitry 600 for compensating for the critical timings of wordline pulsing and sense amplifier setting. Components of delay circuitry 600 include a wordline-pulse driver 604, WULA circuitry 608, a bitcell array 612, and a delay circuit 616. The output of delay circuit 616 is provided to wordline pulse circuitry 620 and sense-amplifier-setting circuitry 624. As can be seen from FIG. 6, this example is based on WULA circuitry 208 of FIG. 2A, in that WULA circuitry 608 includes two pull-down transistors TPDA, TPDB that are activated via corresponding respective buffers 628A, 628B and select signals ASSIST0, ASSIST1. Bitcell matrix 612 includes a plurality of like bitcells 632 which in this example are 6T cells electrically connected as shown in FIG. 6. In one example, bitcell matrix 612 has sixteen bitcells 632. As those skilled in the art will readily appreciate, multiple bitcells 632 are provided to account for variation in the relatively small devices with the bitcells and to provide enough signal strength to create a logic-level voltage. In this example, delay circuit 616 includes an inverter chain 636 having two inverters 636A, 636B. In inverter 636B, the pull-down side of the inverter is connected to ground, whereas in inverter 636A, the pull-down side of the inverter is connected to the pass-gate transistor 640 of each of bitcells 632 in bitcell matrix 612. Consequently, inverter 636A is grounded through pass-gate transistor 640 and pull-down transistor 644 of each bitcell 632 to provide an overall delay that may track with bitcell 632 characteristics. The critical timing is modified according to the select signals ASSIST0, ASSIST1 by adjusting the strength of the pass-gate transistor 640.

Figure 7:
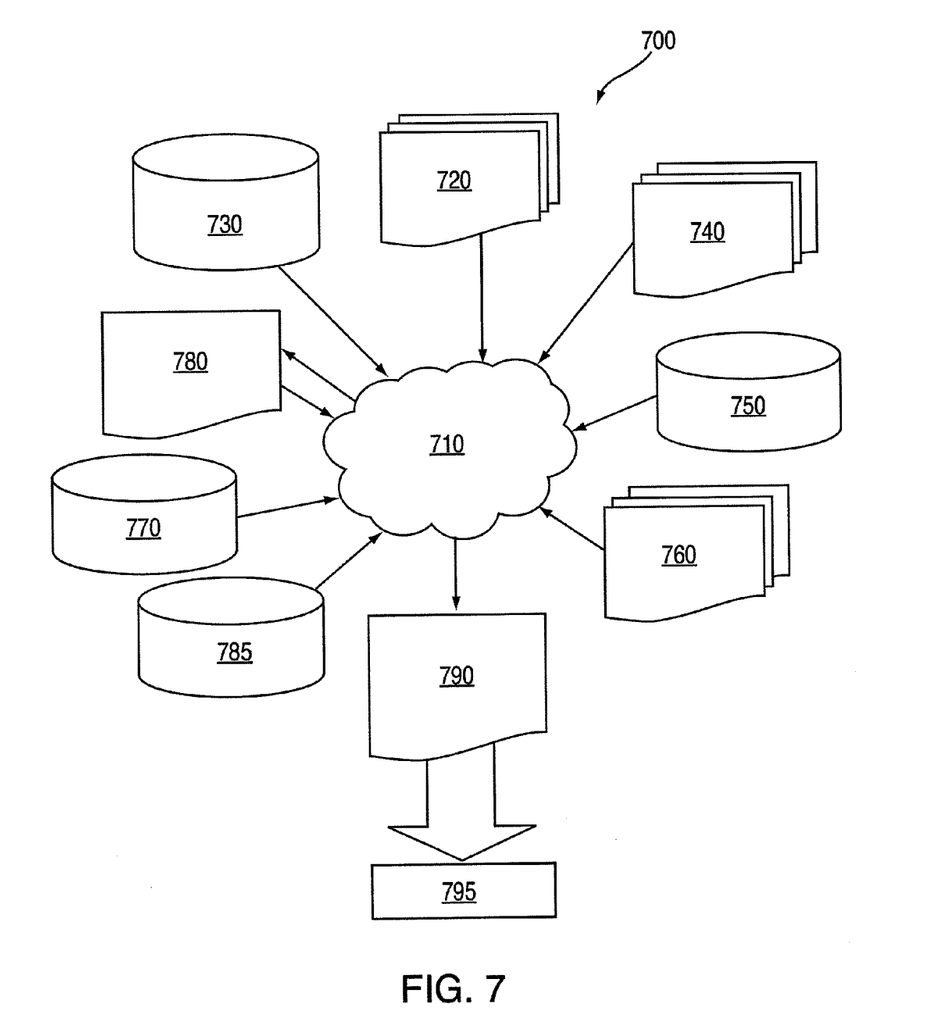
FIG. 7 is a flow diagram of a design process used in semiconductor design, manufacturing, and/or test and that can be used to fabricate an integrated circuit made in accordance with the present disclosure.

FIG. 7 shows a block diagram of an exemplary design flow 700 that can be used to fabricate an IC containing SRAM and WULA circuitry of the present disclosure, such as IC 100 of FIG. 1. Design flow 700 may vary depending on the type of IC being designed. For example, a design flow 700 for building an ASIC may differ from a design flow 700 for designing a standard component. Design structure 720 is preferably an input to a design process 710 and may come from an IP provider, a core developer, or other design company or may be generated by the operator of the design flow, or from other sources. Design structure 720 comprises circuit system 100 in the form of schematics or HDL, a hardware-description language (e.g., Verilog, VHDL, C, etc.). Design structure 720 may be contained on one or more non-transitory machine readable storage mediums, such as optical storage mediums, magnetic storage mediums, and electronic memories, such as RAM, ROM, etc. For example, design structure 720 may be a text file or a graphical representation of circuit system 100. Design process 710 preferably synthesizes (or translates) circuit system 100 into a netlist 780, where netlist 780 is, for example, a list of wires, transistors, logic gates, control circuits, I/O, models, etc. that describes the connections to other elements and circuits in an integrated circuit design and recorded on at least one of machine readable medium. This may be an iterative process in which netlist 780 is resynthesized one or more times depending on design specifications and parameters for the circuit.

Design process 710 may include using a variety of inputs, for example, inputs from library elements 730 which may house a set of commonly used elements, circuits, and devices, including models, layouts, and symbolic representations, for a given manufacturing technology (e.g., different technology nodes, 32 nm, 45 nm, 90 nm, etc.), design specifications 740, characterization data 750, verification data 760, design rules 770, and test data files 785 (which may include test patterns and other testing information). Design process 710 may further include, for example, standard circuit design processes such as timing analysis, verification, design rule checking, place and route operations, etc. One of ordinary skill in the art of integrated circuit design can appreciate the extent of possible electronic design automation tools and applications used in design process 710 without deviating from the scope and spirit of the invention. The design structure of the invention is not limited to any specific design flow.

Design process 710 preferably translates an embodiment of the invention as shown in FIG. 1, along with any additional integrated circuit design or data (if applicable), into a second design structure 790. Design structure 790 resides on a storage medium in a data format used for the exchange of layout data of integrated circuits (e.g. information stored in a GDSII (GDS2), GL1, OASIS, or any other suitable format for storing such design structures). Design structure 790 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1. Design structure 790 may then proceed to a stage 795 where, for example, design structure 790: proceeds to tape-out, is released to manufacturing, is released to a mask house, is sent to another design house, is sent back to the customer, etc.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An integrated circuit, comprising:
    a memory array comprising a plurality of bitcells having a static-random-access-memory (SRAM) architecture;
    a plurality of wordlines operatively connected to said plurality of bitcells; and
    wordline driver circuitry designed and configured to provide a wordline up-level voltage to each of said plurality of wordlines, said wordline driver circuitry including wordline up-level assist circuitry designed and configured to provide a plurality of selectable values for the wordline up-level voltage;
    wherein:
        said wordline up-level assist circuitry includes at least one pull-down device operatively coupled to at least one of said plurality of wordlines so that when said at least one pull-down device is activated, said at least one pull-down device pulls the wordline up-level voltage to one of said plurality of selectable values;
        said wordline up-level assist circuitry includes first and second pull-down devices operatively coupled to at least one of said plurality of wordlines and being independently selectable so as to provide multiple ones of said plurality of selectable values; and
        said first pull-down device has a pull-down strength and said second pull-down device has a pull-down strength that is about twice said pull-down strength of said first pull-down device.

2. An integrated circuit according to claim 1, wherein said at least one pull-down device is a transistor.

3. An integrated circuit according to claim 1, wherein said at least one pull-down device is responsive to a gate voltage and said wordline up-level assist circuitry includes circuitry designed and configured to provide a plurality of values of the gate voltage so as to provide corresponding ones of said plurality of selectable values.

4. An integrated circuit according to claim 1, wherein said wordline up-level assist circuitry includes at least one pull-down device for each of said plurality of wordlines.

5. An integrated circuit according to claim 1, wherein each of said at least one pull-down device is electrically coupled to multiple ones of said plurality of wordlines.

6. An integrated circuit according to claim 1, wherein said wordline up-level assist circuitry is designed and configured to be active only during a read cycle of said memory array.

7. An integrated circuit according to claim 1, further comprising wordline pulse circuitry and delay circuitry in electrical communication with said wordline pulse circuitry, said delay circuitry including:
    a plurality of cells having said SRAM architecture; and
    a delay buffer grounded through said plurality of cells;
    wherein said plurality of cells are driven by said wordline up-level assist circuitry.

8. An integrated circuit according to claim 1, wherein said wordline driver circuitry includes wordline pulse circuitry and said SRAM circuitry further includes delay circuitry in electrical communication with said wordline pulse circuitry, said delay circuitry including:
    a plurality of cells having SRAM architecture; and
    a delay buffer grounded through said plurality of cells;
    wherein said plurality of cells are driven by said wordline up-level assist circuitry.

9. An integrated circuit, comprising:
    static random access memory (SRAM) circuitry that includes:
        a complementary pair of bitlines having a first bitline and a second bitline;
        a first pass-gate device having a first gate electrode;
        a second pass-gate device having a second gate electrode;
        a bit cell containing:
            a first internal node electrically coupled to said first bitline across said first pass-gate device, said first internal node provided to be charged to a bit-value voltage level during use of said bit cell to store a bit value; and
            a second internal node electrically coupled to said second bitline across said second pass-gate device, said second internal node provided to be charged to the complement of the bit value voltage level during use of said bit cell to store the bit value;
        a wordline electrically coupled to each of said first and second gate electrodes, respectively, of said first and second pass-gate transistors; and
        wordline driver circuitry electrically coupled to said wordline so as to provide said wordline with an up-level voltage, wherein said wordline driver circuitry includes:
            wordline up-level assist circuitry configured to provide, one at a time, a plurality of selectable predetermined voltage levels for the up-level voltage; and
            selection circuitry responsive to a selection input that effects the selection of the up-level voltage from the plurality of selectable predetermined voltage values;
        wherein:
            said wordline driver circuitry further includes a voltage source operatively configured to drive said wordline with an up-level pulse in response to a memory-operation event, said wordline up-level assist circuitry including at least one pull-down device each electrically coupled to said input circuitry and to said wordline downstream of said voltage source and upstream of said first and second pass-gate devices in a manner that provides the ability to pull-down the wordline up-level voltage of the wordline to one of the plurality of selectable predetermined voltage values in response to the selection input; and
            said at least one pull-down device includes a first pull-down device having a first current strength and a second pull-down device having a second current strength that is about twice said second current strength, wherein each of said first and second pull-down devices are independently controllable so as to provide four possible predetermined up-level voltages.

10. An integrated circuit according to claim 9, wherein said at least one pull-down device is responsive to a gate voltage and said wordline up-level assist circuitry includes circuitry designed and configured to provide a plurality of values of the gate voltage so as to provide corresponding ones of said plurality of selectable values.

11. An integrated circuit according to claim 9, wherein said wordline up-level assist circuitry is designed and configured to be active only during a read cycle of said SRAM circuitry.

12. An integrated circuit, comprising:
a memory array comprising a plurality of bitcells having a static-random-access-memory (SRAM) architecture;
a plurality of wordlines operatively connected to said plurality of bitcells;
wordline driver circuitry designed and configured to provide a wordline up-level voltage to each of said plurality of wordlines, said wordline driver circuitry including wordline up-level assist circuitry designed and configured to provide a plurality of selectable values for the wordline up-level voltage; and
wordline pulse circuitry and delay circuitry in electrical communication with said wordline pulse circuitry, said delay circuitry including:
a plurality of cells having said SRAM architecture; and
a delay buffer grounded through said plurality of cells;
wherein said plurality of cells are driven by said wordline up-level assist circuitry.

13. An integrated circuit according to claim 12, wherein said wordline up-level assist circuitry includes at least one pull-down device operatively coupled to at least one of said plurality of wordlines so that when said at least one pull-down device is activated, said at least one pull-down device pulls the wordline up-level voltage to one of said plurality of selectable values.

14. An integrated circuit according to claim 13, wherein said wordline up-level assist circuitry includes first and second pull-down devices operatively coupled to at least one of said plurality of wordlines and being independently selectable so as to provide multiple ones of said plurality of selectable values.

15. An integrated circuit according to claim 14, wherein said first pull-down device has a pull-down strength and said second pull-down device has a pull-down strength that is about twice said pull-down strength of said first pull-down device.

16. An integrated circuit according to claim 13, wherein said at least one pull-down device is a transistor.

17. An integrated circuit according to claim 13, wherein said at least one pull-down device is responsive to a gate voltage and said wordline up-level assist circuitry includes circuitry designed and configured to provide a plurality of values of the gate voltage so as to provide corresponding ones of said plurality of selectable values.

18. An integrated circuit according to claim 13, wherein said wordline up-level assist circuitry includes at least one pull-down device for each of said plurality of wordlines.

19. An integrated circuit according to claim 13, wherein each of said at least one pull-down device is electrically coupled to multiple ones of said plurality of wordlines.

20. An integrated circuit according to claim 12, wherein said wordline up-level assist circuitry is designed and configured to be active only during a read cycle of said memory array.

21. An integrated circuit, comprising:
static random access memory (SRAM) circuitry that includes:
a complementary pair of bitlines having a first bitline and a second bitline;
a first pass-gate device having a first gate electrode;
a second pass-gate device having a second gate electrode;
a bit cell containing:
a first internal node electrically coupled to said first bitline across said first pass-gate device, said first internal node provided to be charged to a bit-value voltage level during use of said bit cell to store a bit value; and
a second internal node electrically coupled to said second bitline across said second pass-gate device, said second internal node provided to be charged to the complement of the bit value voltage level during use of said bit cell to store the bit value;
a wordline electrically coupled to each of said first and second gate electrodes, respectively, of said first and second pass-gate transistors; and
wordline driver circuitry electrically coupled to said wordline so as to provide said wordline with an up-level voltage, wherein said wordline driver circuitry includes:
wordline up-level assist circuitry configured to provide, one at a time, a plurality of selectable predetermined voltage levels for the up-level voltage; and
selection circuitry responsive to a selection input that effects the selection of the up-level voltage from the plurality of selectable predetermined voltage values;
wherein said wordline driver circuitry includes wordline pulse circuitry and said SRAM circuitry further includes delay circuitry in electrical communication with said wordline pulse circuitry, said delay circuitry including:
a plurality of cells having SRAM architecture; and
a delay buffer grounded through said plurality of cells;
wherein said plurality of cells are driven by said wordline up-level assist circuitry.

22. An integrated circuit according to claim 21, wherein said wordline driver circuitry further includes a voltage source operatively configured to drive said wordline with an up-level pulse in response to a memory-operation event, said wordline up-level assist circuitry including at least one pull-down device each electrically coupled to said input circuitry and to said wordline downstream of said voltage source and upstream of said first and second pass-gate devices in a manner that provides the ability to pull-down the wordline up-level voltage of the wordline to one of the plurality of selectable predetermined voltage values in response to the selection input.

23. An integrated circuit according to claim 22, wherein said at least one pull-down device includes a first pull-down device having a first current strength and a second pull-down device having a second current strength that is about twice said second current strength, wherein each of said first and second pull-down devices are independently controllable so as to provide four possible predetermined up-level voltages.

24. An integrated circuit according to claim 21, wherein said at least one pull-down device is responsive to a gate voltage and said wordline up-level assist circuitry includes circuitry designed and configured to provide a plurality of values of the gate voltage so as to provide corresponding ones of said plurality of selectable values.

25. An integrated circuit according to claim 21, wherein said wordline up-level assist circuitry is designed and configured to be active only during a read cycle of said SRAM.

* * * * *